United States Patent
Zheng et al.

(10) Patent No.: US 12,035,589 B2
(45) Date of Patent: Jul. 9, 2024

(54) DISPLAY SUBSTRATE, AND DISPLAY DEVICE

(71) Applicant: BOE Technology Group Co., Ltd., Beijing (CN)

(72) Inventors: Can Zheng, Beijing (CN); Libin Liu, Beijing (CN); Shiming Shi, Beijing (CN); Zewen Bo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 448 days.

(21) Appl. No.: 17/507,590

(22) Filed: Oct. 21, 2021

(65) Prior Publication Data

US 2022/0216290 A1 Jul. 7, 2022

(30) Foreign Application Priority Data

Jan. 6, 2021 (CN) .......................... 202110012677.7

(51) Int. Cl.
*H10K 59/131* (2023.01)
*H10K 59/40* (2023.01)

(52) U.S. Cl.
CPC ........... *H10K 59/131* (2023.02); *H10K 59/40* (2023.02)

(58) Field of Classification Search
CPC ............................. H10K 59/131; H10K 59/40
See application file for complete search history.

(56) References Cited

U.S. PATENT DOCUMENTS

2018/0188584 A1* 7/2018 Yeh .................... G02F 1/1337
2020/0194516 A1* 6/2020 Kim ..................... H10K 77/111

* cited by examiner

*Primary Examiner* — Kyoung Lee
(74) *Attorney, Agent, or Firm* — IPro, PLLC

(57) ABSTRACT

The present disclosure discloses a display substrate and a display device. The display substrate comprises: a display area, a binding area, and a fan-out area located between the display area and the binding area, the fan-out area comprises a touch control lead wire, a data lead wire, and at least one shielded wire located between the touch control lead wire and the data lead wire, and the at least one shielded wire is grounded or connected to a fixed potential.

12 Claims, 3 Drawing Sheets

DISPLAY SUBSTRATE, AND DISPLAY DEVICE

CROSS-REFERENCE TO RELATED APPLICATIONS

This application claims priority to Chinese Patent Application No. 202110012677.7 filed in China on Jan. 6, 2021, the entire contents of which are hereby incorporated by reference.

TECHNICAL FIELD

The present disclosure relates to the field of displays, and in particular, to a display substrate and a display device.

BACKGROUND

With the development of display technology, display devices based on organic light emitting diodes (OLEDs) have been widely used. In addition, more and more OLED display devices are equipped with a touch control module to realize a touch control function. With the application of the touch control module on the OLED display device, how to rationally route so as to prevent crosstalk between the signal wires of the touch control module and the display panel has become an urgent problem to be solved.

SUMMARY

In one aspect of the present disclosure, a display substrate is provided. The display substrate comprises a display area, a binding area, and a fan-out area located between the display area and the binding area, the fan-out area comprises a touch control lead wire, a data lead wire, and at least one shielded wire located between the touch control lead wire and the data lead wire, and the at least one shielded wire is grounded or connected to a fixed potential. Thus, the display substrate can effectively alleviate or even avoid cross talk between the touch control lead wires and the data lead wires, which is advantageous for improving the performance of a display device using the display substrate.

According to an embodiment of the present disclosure, the fan-out area comprises a first fan-out area and a second fan-out area, and a bending area located between the first fan-out area and the second fan-out area, the first fan-out area being adjacent to the display area, the binding area being located at one side of the second fan-out area away from the bending area.

According to an embodiment of the present disclosure, the display substrate comprises a touch structure, the touch structure comprising a touch control electrode located in the display area, and the touch control lead wire connected to the touch control electrode and extending to the fan-out area and the binding area.

According to an embodiment of the present disclosure, the shielded wire is a ground wire or a direct current signal wire. Thus, cross talk between the touch control lead wires and the data lead wires can be effectively mitigated or even avoided without significantly increasing non-display area routing.

According to an embodiment of the present disclosure, the first fan-out area comprises: a substrate; a gate electrode layer located on the substrate; a source/drain electrode layer, wherein the source/drain electrode layer is located at one side of the gate electrode layer away from the gate electrode layer, and is separated from the gate electrode layer with an insulating medium therebetween; a shielding layer located at one side of the source/drain electrode layer away from the substrate; and a metal trace layer, wherein the metal trace is located at one side of the shielding layer away from the substrate, and is separated from the shielding layer with a second insulating medium therebetween. Thus, the performance of the display substrate can be further improved.

According to an embodiment of the present disclosure the data lead wire, the touch control lead wire, and the shielded wire extend from the display area to the first fan-out area, respectively, and the shielding layer at the first fan-out area is a positive power supply line and a negative power supply line. Thus, cross-talk between the touch control lead wire and the data lead wire can be effectively mitigated or even avoided with the positive and negative power supply lines having a wide width for accessing the direct current signal.

According to an embodiment of the present disclosure, the data lead wire, the touch control lead and the shielded wire extend from the first fan-out area to the bending area, respectively, and are all connected to the source/drain electrode layer at the bending area by via connection, the touch control lead wire is divided into a plurality of touch control lead wire groups, the data lead wire is divided into a plurality of data lead wire groups, the touch control lead wire groups and the data lead wire groups are alternately arranged one by one, and adjacent touch control lead wire groups and data lead wire groups in the bending area are separated with ground wires therebetween. Thus, the performance of the display substrate can be further improved.

According to an embodiment of the present disclosure, at least one pair of adjacent touch control lead wire groups and data lead wire groups are separated with one or more ground wires therebetween. Thus, the performance of the display substrate can be further improved.

According to an embodiment of the present disclosure, each pair of adjacent touch control lead wire groups and data lead wire groups are separated with at least one ground wire. Thus, the performance of the display substrate can be further improved.

According to an embodiment of the present disclosure, the data lead wire and the touch control lead wire are connected to the gate electrode layer by via connection in the second fan-out area, and adjacent touch control lead wire groups and data lead wire groups are separated with ground wires therebetween. Thus, the performance of the display substrate can be further improved.

According to an embodiment of the present disclosure, the display substrate further comprises an anti-static component arranging area and a third fan-out area located between the second fan-out area and the binding area, the anti-static component arranging area has a plurality of anti-static element groups, each of the anti-static element groups has a plurality of anti-static elements, the data lead wire is connected to the anti-static elements, the touch control lead wire is located between two adjacent anti-static element groups, and the touch control lead wire and the anti-static element groups are separated by the grounding wire. Thus, the performance of the display substrate can be further improved.

In another aspect of the present disclosure, the present disclosure provides a method for making a display substrate as described above. The method comprises: providing a substrate; arranging a touch control lead wire and a data lead wire on a fan-out area of the substrate, and arranging at least one shielded wire between the touch control lead wire and the data lead wire, and the at least one shielded wire being grounded or connected to a fixed potential. Thus, the aforementioned display substrate can be simply obtained, and the display substrate obtained by the method has all the features and advantages of the aforementioned display substrate, which will not be described in detail herein.

According to an embodiment of the present disclosure, the shielded wire is formed based on the metal of the source/drain electrode layer and the gate electrode layer using a patterning process, and the shielded wire includes a ground wire or a direct current signal wire. Thus, the shielded wire can be easily formed.

In yet another aspect of the present disclosure, the present disclosure is directed to a display device. The display device comprises: a display substrate as hereinbefore described or obtainable by a method as hereinbefore described. Thus, the display device has all the features and advantages of the display substrate described above, and will not be described in detail herein. Overall, the display substrate has the advantage of superior performance.

BRIEF DESCRIPTION OF THE DRAWINGS

The foregoing and/or additional aspects and advantages of the disclosure will become apparent and more readily appreciated from the following description of the embodiments, taken in conjunction with the accompanying drawings, in which.

DETAILED DESCRIPTION

Figure 1:
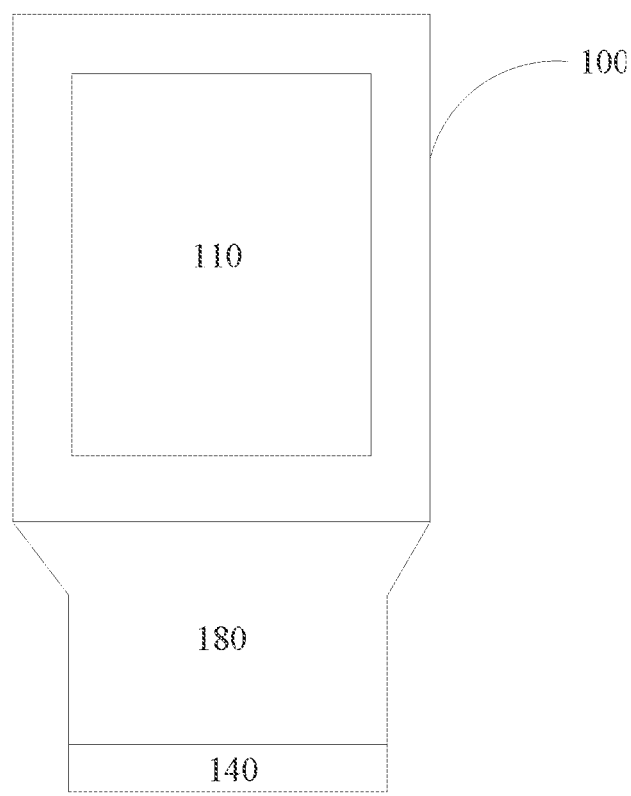
FIG. 1 shows a schematic top view structure of a display substrate according to one embodiment of the present disclosure.

Reference will now be made in detail to the embodiments of the present disclosure, examples of which are illustrated in the accompanying drawings, wherein like or similar reference numerals refer to the same or similar elements or elements having the same or similar function throughout. The embodiments described below by referring to the figures are exemplary only to illustrate the disclosure and are not to be construed as limiting the disclosure.

In one aspect of the present disclosure, a display substrate is provided. The inventors have found that when a touch control module is integrated on an OLED backplate, how to reduce the crosstalk between a lead-out wiring of a self-contained touch signal and a lead-out wiring of a data lead wire (such as a source signal) becomes a technical problem to be solved urgently for a display device having a touch control module. The display substrate proposed by the present disclosure can alleviate or even solve the above technical problems. According to an embodiment of the present disclosure, referring to FIG. 1, the display substrate 1000 includes: a substrate 100, wherein the substrate 100 is divided into a display area 110, a binding area 140 and a fan-out area 180 located between the display area and the binding area, the fan-out area 180 comprises a touch control lead, a data lead wire and at least one shielding line (not shown in the figure) located between the touch control lead and the data lead wire, and the at least one shielding line is grounded or connected to a fixed potential. Thus, the display substrate can effectively alleviate or even avoid cross talk between the touch control lead wires and the data lead wires, which is advantageous for improving the performance of a display device using the display substrate.

Figure 2:
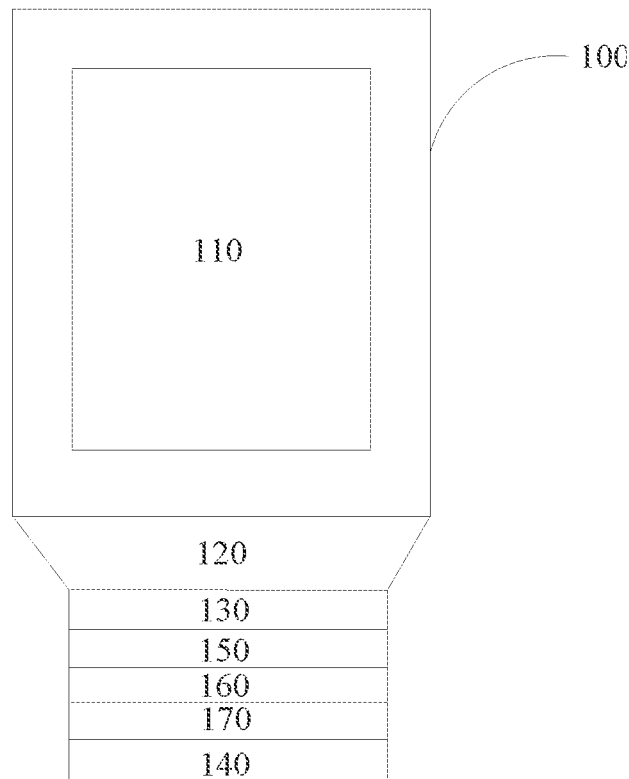
FIG. 2 shows a schematic top view structure of a display substrate according to another embodiment of the present disclosure.

Specifically, referring to FIG. 2, the fan-out area 180 may comprise a first fan-out area 120, a bending area 130, and a second fan-out area 150, wherein the first fan-out area 120 is adjacent to the display area 110, and the first fan-out area 120 and the second fan-out area 150 are connected via the bending area 130, the binding area 140 is connected to the second fan-out area 150, and parts of the binding area 140 and the second fan-out area 150 may be bent to the back side of the light-emitting surface of the display area 110 via the bending area 130. The touch structure comprises a touch control electrode located in the display area, and a touch control lead wire (not shown in the figure) connected to the touch control electrode and extending to the fan-out area. A shielded wire 300 is spaced between the touch control lead 400 and the data lead wire 200.

For convenience of understanding, the principle that the display substrate can achieve the aforementioned advantageous effects will first be briefly explained as follows:

As previously mentioned, when the touch structure is integrated on the display substrate, cross-talk with the data lead wires (e.g., source lines) in the display substrate tends to occur. Therefore, the present disclosure can prevent the signals of the touch control lead wire and the data lead wire from interfering with each other by providing a shielded wire between the two, so that the performance of the display substrate can be improved. Specifically, taking a backplane of an OLED as an example, a display substrate generally comprises a substrate 100 and a backplane circuit structure located on the substrate 100 so as to realize the control of an organic light-emitting diode. The backplane circuit structure may include, among other things, a semiconductor layer on the substrate 100, and a plurality of metal layers and insulating dielectrics. For example, the side of the semiconductor layer remote from the substrate 100 may have a gate insulating layer and a gate layer, the gate layer being located on the side of the semiconductor layer remote from the substrate 100. The source/drain electrode layer is located on a side of the gate electrode layer away from the semiconductor layer, and an insulating dielectric is spaced apart from the gate electrode layer. The metal wiring layer is located on a side of the source/drain electrode layer away from the gate electrode layer, and a second insulating medium is spaced apart from the source/drain electrode layer. In the display area, the above-mentioned structure can form a backplane circuit structure for controlling an organic light-emitting diode, for example, a plurality of thin film transistors can be formed, and various types of traces and a capacitor structure required for the backplane circuit are formed using a metal layer (a gate electrode layer 30, a source/drain electrode layer 50 and a metal trace layer 70). Wherein the data lead wire 400 can be located at the gate electrode layer 30, and the touch control electrode and the touch control lead 200 are located at the metal wiring layer 70. In the first fan-out area, a shielding layer may be provided on a side of the source/drain electrode layer away from the substrate to form a shielding line. Thus, it is possible to perform space shielding in a direction perpendicular to the plane of the substrate 100 using the shielding lines 300 at least in a fan-out area such as the first fan-out area, thereby preventing crosstalk of signals of both. In the non-display area, a shielded wire may also be provided between the data lead wire 400 and the touch control lead wire 200 through a via or the like. Thus, the display signal and the touch signal can be effectively prevented from crosstalk with each other without significantly increasing the number and width of the wiring.

It needs to be specifically stated here that the number of the gate electrode layer, the source/drain electrode layer and the metal layer is not particularly limited, and a person skilled in the art would have been able to design according to the specific structure of the back panel circuit and the specific situation of the touch control structure. For example, the display substrate may comprise two gate electrode layers, i.e., having a first gate electrode layer and a second gate electrode layer, so as to realize a backplane circuit with a structure including but not limited to 7T1C or 14T1C, and an insulating dielectric may be spaced between the first gate electrode layer and the second gate electrode layer. The display substrate may also have two source/drain electrode layer, namely: there may be a first source/drain electrode layer and a second source/drain electrode layer to realize the preparation of a source electrode, a drain electrode, a source line and a capacitor structure of a plurality of thin film transistors, and an insulating medium may be spaced between the first source/drain electrode layer and the second source/drain electrode layer. The display substrate may also have two metal wiring layers, a first metal wiring layer and a second metal wiring layer. The two metal wiring layers can be used to form various types of metal wiring and form a touch control electrode. For example, the touch control structure can be a self-contained touch control structure, and specifically can comprise a first touch control electrode and a second touch control electrode. Two touch control electrodes can be respectively located at two metal wiring layers, and the middle is separated by an insulating medium so as to realize a touch control function. Similarly, the first metal trace layer and the second metal trace layer may be separated by an insulating dielectric.

According to embodiments of the present disclosure, the shielded wire may be a ground wire or a direct current signal wire. The direct current signal is generally a metal trace having a wide width, and a direct current voltage is applied thereto, which can be used to shield a display signal and a touch signal. Alternatively, the shielded wire may be formed using a ground wire. Thus, cross talk between the touch control lead wire and the data lead wire can be effectively mitigated or even avoided without significantly increasing the non-display area routing.

According to an embodiment of the present disclosure, the data lead wire, the touch control lead wire, and the shielded wire extend from the display area to the first fan-out area, respectively, and the shielded wire at the first fan-out area may be a positive power supply line and a negative power supply line (VDD/VSS) line. Thus, cross-talk between the touch control lead wire and the data lead wire can be effectively mitigated or even avoided with the VDD/VSS line having a wide width and a direct current signal connected thereto. Also, the data lead wire and the touch control lead wire at the first fan-out area may have an overlapping area in the direction perpendicular to the plane of the substrate 100, and the two may be better spaced in the vertical direction by the VDD/VSS line at the source/drain electrode layer.

Figure 3:
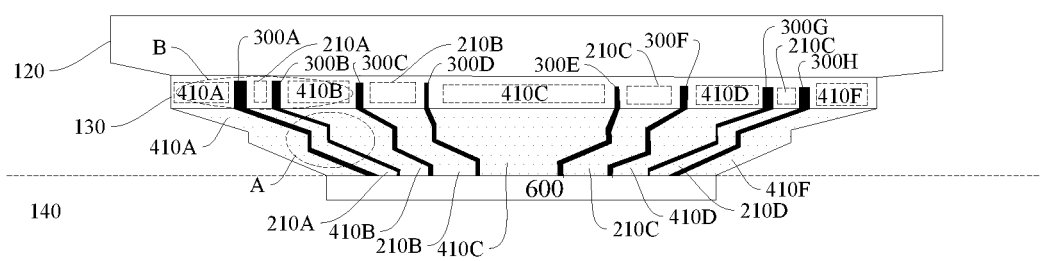
FIG. 3 shows a schematic top view of a partial structure of a display substrate according to one embodiment of the present disclosure.

According to embodiments of the present disclosure, with reference to FIG. 3, data lead wires, touch control lead wires, and shield leads may each extend from the first fan-out area 120 to the bending area 130. As described above, since the substrate will be bent at the bending area and the structure such as the second fan-out area will be bent to the back side of the light-emitting surface of the display area, it is necessary to connect multiple layers of metal at the bending area to the same metal layer through the via hole, so as to thin the thickness of the bending area and prevent the multiple layers of metal from being broken at the bending area. The data lead wire and the touch control lead wire can both be connected to the source/drain electrode layer through a via connection at the bending area, and the metal of the source/drain electrode layer is used to form structures such as a data lead wire, a touch control lead wire and a shielded wire.

When the data lead wire, the touch control lead wire and the shielded wire extend to the region between the bending area 130 and the binding area 140, the data lead wire and the touch control lead wire may be connected to a position such as a gate electrode layer via a via bar line and fan-out wiring is performed, and at least one ground wire is spaced between the touch control lead wire group and the data lead wire group. Thus, the touch signal and the data signal can be spaced apart to avoid mutual crosstalk. For example, between a plurality of pairs of adjacent touch control lead wire groups and data lead wire groups, one or more ground wires are spaced between at least one pair of adjacent touch control lead wire groups and data lead wire groups. The number of ground wires spaced between the touch control lead wire set and the data lead wire set is not particularly limited and may be one or more in number to further improve the safety performance of the circuit and the anti-crosstalk performance. For example, according to one particular embodiment of the present disclosure, a ground wire may be provided between each pair of adjacent touch control lead wire groups and data lead wire groups. Specifically, at least one ground wire may be spaced between the two. Similarly, a plurality of ground wires may be provided between each pair of adjacent touch control lead wire groups and data lead wire groups. Subsequently, the set of touch control lead wires and the set of data lead wires may be extended to the binding area 140 to be connected to the control IC 600 to realize a display function and a touch function.

Figure 4:
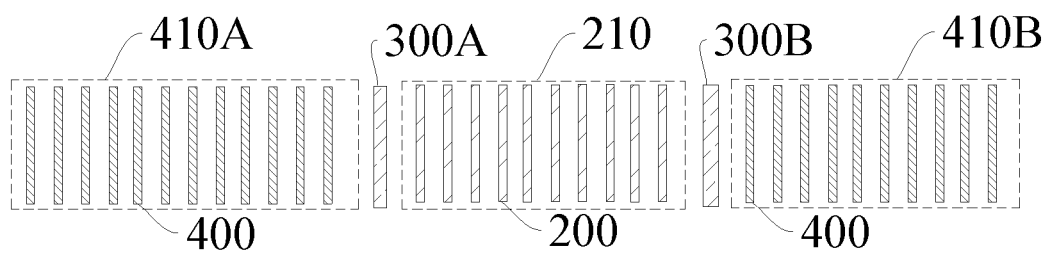
FIG. 4 shows an enlarged schematic view of area B in FIG. 3.

Specifically, referring to FIG. 4, the touch control lead wire 200 may be divided into a plurality of touch control lead wire groups 210 (only one is shown in FIG. 4), and the data lead wire 400 is divided into a plurality of data lead wire groups. At the bending area 130, along the plane where the substrate 100 is located, in a direction perpendicular to the direction from the display area to the bending area, the touch control lead groups and the data lead wire groups are alternately arranged with each other, and shielded wires (300A and 300B as shown in the figure) are spaced between adjacent touch control lead groups and data lead wire groups located in the bending area, wherein the shielded wires can be ground wires. Since there is only one layer of metal structure at the bending area, it is impossible to shield the two at intervals in a direction perpendicular to the plane of the substrate 100, and the structure as shown in FIG. 4 can easily space a plurality of touch control lead groups and data lead wire groups.

According to an embodiment of the present disclosure, the data lead wire and the touch control lead wire may both be connected to the source/drain electrode layer through a via connection in the second fan-out area, and a ground wire may be spaced between adjacent groups of the touch control lead wire and the data lead wire. Thus, the performance of the display substrate can be further improved. Similarly, the touch control lead wire set and the data lead wire set may be spaced apart by a ground wire in at least one or several pairs of a plurality of pairs of adjacent touch control lead wire groups and data lead wire groups, or all of the adjacent touch control lead wire groups and data lead wire groups may be spaced apart by a ground wire. The number of ground wires between the touch control lead wire set and the data lead wire set may also be one or more.

Figure 5:
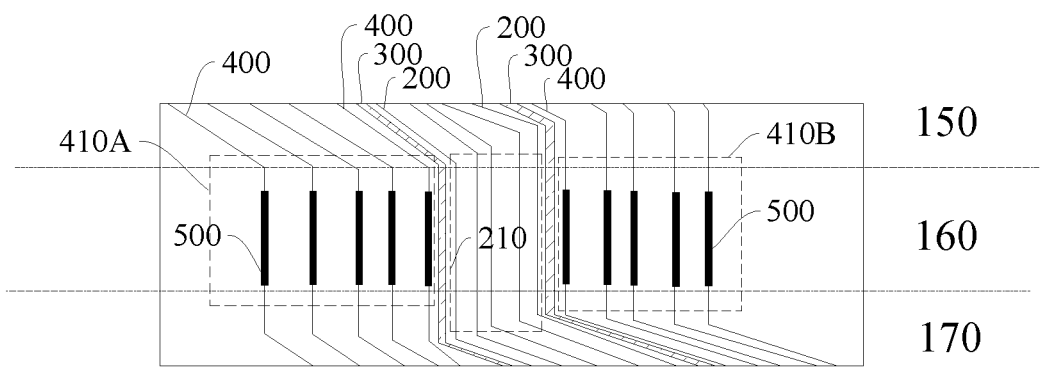
FIG. 5 shows an enlarged schematic view of area A in FIG. 3.

According to an embodiment of the present disclosure, referring to FIG. 5, a direction pointing from the second fan-out section 150 to the binding area 140 may further have an anti-static component placement section 160 and a third fan-out section 170 disposed in order. There may be a plurality of anti-static element groups at the anti-static component installation region 160, each of the anti-static element groups having a plurality of anti-static elements 500, and the data lead wires 400 are connected to the anti-static elements 500 to improve the anti-static capability of the display substrate. The touch control lead wire 200 is located between two adjacent antistatic element groups, and the touch control lead wire 200 and the antistatic element groups may be separated by a shielded wire 300, for example, by a ground wire. Specifically, the display substrate may have a plurality of ground wires, and in the third sector-out region, the ground wires between the touch control lead wire group (210 as shown in the figure) and the data lead wire group (410A and 410B as shown in the figure) may be connected to the source/drain electrode layer (not shown in the figure) through vias, and the ground wires connected to the source/drain electrode layer are spaced between the touch control lead wire group and the data lead wire group. Thus, the performance of the display substrate can be further improved.

In another aspect of the present disclosure, the present disclosure provides a method of making the foregoing display substrate. The method comprises: providing a substrate; arranging a touch control lead wire and a data lead wire on the fan-out area of the substrate, and arranging at least one shielded wire between the touch control lead wire and the data lead wire, the at least one shielded wire being grounded or connected to a fixed potential. Thus, the aforementioned display substrate can be simply obtained, and the display substrate obtained by the method has all the features and advantages of the aforementioned display substrate, which will not be described in detail herein.

Specifically, the display substrate may comprise a touch control structure, wherein the touch control structure comprises a touch control electrode located in a display area, and a touch control lead connected to the touch control electrode and extending to a fan-out area; A shielded wire is provided between the touch control lead wire and the data lead wire.

According to an embodiment of the present disclosure, providing a shielded wire includes: using a patterning process, a shielding line is formed based on the metal of the source/drain electrode layer and the gate electrode layer, and the shielding line comprises a grounding line or a direct current signal wire. Thus, the shielded wire can be easily formed.

Other structures of the display substrate, such as a thin film transistor, a backplane circuit structure, etc. have been described in detail above, and will not be described in detail herein. A person skilled in the art would have been able to form the above-mentioned various laminated structures by means including, but not limited to, depositing relevant materials and performing a patterning process, and form the above-mentioned data lead wire, touch control lead and shielded wire at the corresponding metal layer using a metal.

In yet another aspect of the present disclosure, the present disclosure is directed to a display device. The display device comprises: a display substrate as hereinbefore described or obtainable by a method as hereinbefore described. Thus, the display device has all the features and advantages of the display substrate described above, and will not be described in detail herein. Overall, the display substrate has the advantage of superior performance.

In the description of the present disclosure, the terms "upper", "lower", and the like indicate orientations or positional relationships based on the orientations or positional relationships shown in the figures, merely to facilitate the description of the present disclosure and not to require that the present disclosure must be constructed and operated in a particular orientation, and thus should not be construed as limiting the present disclosure.

In the description herein, reference to a description by the terms "one embodiment", "another embodiment", etc. means that a particular feature, structure, material, or characteristic described in connection with the embodiment is included in at least one embodiment of the present disclosure. In this specification, schematic representations of the above terms do not necessarily refer to the same embodiment or example. Furthermore, the particular features, structures, materials, or characteristics described may be combined in any suitable manner in any one or more embodiments or examples. Furthermore, combinations and combinations of the various embodiments or examples and features of the various embodiments or examples described in this specification can be made by those skilled in the art without departing from the scope of the invention. In addition, it is noted that in this specification the terms "first" and "second" are used for descriptive purposes only and are not to be interpreted as indicating or implying relative importance or as implicitly indicating the number of technical features indicated.

While embodiments of the present disclosure have been shown and described above, it will be understood that the above-described embodiments are exemplary and are not to be construed as limiting the present disclosure, and that variations, modifications, substitutions, and alterations to the above-described embodiments may be made by one of ordinary skill in the art within the scope of the present disclosure.

What is claimed is:

1. A display substrate, comprising a display area, a binding area, and a fan-out area located between the display area and the binding area,
    the fan-out area comprises a touch control lead wire, a data lead wire, and at least one shielded wire located between the touch control lead wire and the data lead wire, and the at least one shielded wire is grounded or connected to a fixed potential.

2. The display substrate according to claim 1, wherein the fan-out area comprises a first fan-out area and a second fan-out area, and a bending area located between the first fan-out area and the second fan-out area, the first fan-out area being adjacent to the display area, the binding area being located at one side of the second fan-out area away from the bending area.

3. The display substrate according to claim 1, wherein the display substrate comprises a touch structure, the touch structure comprising a touch control electrode located in the display area, and the touch control lead wire connected to the touch control electrode and extending to the fan-out area and the binding area.

4. The display substrate according to claim 1, wherein the shielded wire is a ground wire or a direct current signal wire.

5. The display substrate according to claim 2, wherein the first fan-out area comprises:
   a substrate;
   a gate electrode layer located on the substrate;
   a source/drain electrode layer, wherein the source/drain electrode layer is located at one side of the gate electrode layer away from the gate electrode layer, and is separated from the gate electrode layer with an insulating medium therebetween;
   a shielding layer located at one side of the source/drain electrode layer away from the substrate; and
   a metal trace layer, wherein the metal trace is located at one side of the shielding layer away from the substrate, and is separated from the shielding layer with a second insulating medium therebetween.

6. The display substrate according to claim 5, wherein the data lead wire, the touch control lead wire, and the shielded wire extend from the display area to the first fan-out area, respectively, and the shielding layer at the first fan-out area is a positive power supply line and a negative power supply line.

7. The display substrate according to claim 6, wherein the data lead wire, the touch control lead and the shielded wire extend from the first fan-out area to the bending area, respectively, and are all connected to the source/drain electrode layer at the bending area by via connection,
   the touch control lead wire is divided into a plurality of touch control lead wire groups, the data lead wire is divided into a plurality of data lead wire groups, the touch control lead wire groups and the data lead wire groups are alternately arranged one by one, and adjacent touch control lead wire groups and data lead wire groups in the bending area are separated with ground wires therebetween.

8. The display substrate according to claim 7, wherein at least one pair of adjacent touch control lead wire groups and data lead wire groups are separated with one or more ground wires therebetween.

9. The display substrate according to claim 8, wherein each pair of adjacent touch control lead wire groups and data lead wire groups are separated with at least one ground wire.

10. The display substrate according to claim 7, wherein the data lead wire and the touch control lead wire are connected to the gate electrode layer by via connection in the second fan-out area, and adjacent touch control lead wire groups and data lead wire groups are separated with ground wires therebetween.

11. The display substrate according to claim 10, further comprising an anti-static component arranging area and a third fan-out area located between the second fan-out area and the binding area,
   the anti-static component arranging area has a plurality of anti-static element groups, each of the anti-static element groups has a plurality of anti-static elements, the data lead wire is connected to the anti-static elements, the touch control lead wire is located between two adjacent anti-static element groups, and the touch control lead wire and the anti-static element groups are separated by the grounding wire.

12. A display device, comprising the display substrate of claim 1.

* * * * *